United States Patent

Choi et al.

Patent Number: 5,957,654
Date of Patent: Sep. 28, 1999

[54] LEAD FRAME UNLOADING TOOL HAVING SLIDING BLOCKS

[75] Inventors: Jun Hyuk Choi; Tai Kew Choi; Jung Kun Lee; Jae Won Lee, all of Asan, Rep. of Korea

[73] Assignee: Samsung Electronics Co., Ltd., Suwon, Rep. of Korea

[21] Appl. No.: 08/764,583

[22] Filed: Dec. 13, 1996

[30] Foreign Application Priority Data

Dec. 14, 1995 [KR] Rep. of Korea ................. 95-49659

[51] Int. Cl.⁶ .................................................. B66C 1/00
[52] U.S. Cl. ........................... 414/797; 414/900; 294/65
[58] Field of Search ........................ 414/795.7, 796.7, 414/797, 900, 913; 294/65

[56] References Cited

U.S. PATENT DOCUMENTS

| | | | |
|---|---|---|---|
| 3,860,280 | 1/1975 | Karlsson | 294/65 |
| 4,685,714 | 8/1987 | Hoke | 294/65 |
| 5,284,413 | 2/1994 | Wilkinson et al. | 294/65 |
| 5,575,376 | 11/1996 | Colamussi | 294/65 |
| 5,653,575 | 8/1997 | Park et al. | 414/797 |
| 5,685,589 | 11/1997 | Kikuchi et al. | 294/65 |

FOREIGN PATENT DOCUMENTS

| | | | |
|---|---|---|---|
| 2047606 | 3/1972 | Germany | 294/65 |
| 2501888 | 7/1976 | Germany | 294/65 |
| 97371 | 10/1960 | Netherlands | 294/65 |
| 1291258 | 2/1987 | U.S.S.R. | 414/797 |
| 2207413 | 6/1987 | United Kingdom | 294/65 |

*Primary Examiner*—Karen B. Merritt
*Assistant Examiner*—Douglas Hess
*Attorney, Agent, or Firm*—Jones & Volentine, L.L.P.

[57] ABSTRACT

A lead frame unloading apparatus includes a pair of opposing plate members, one of which has a long horizontal slit. The opposing plate members define a central space where one or more sliding blocks are located, each of the sliding blocks having a vertical through hole at its center. A picker penetrates through the vertical hole within each respective sliding block, each picker is immobilized when it contacts a lead frame for pickup thereby allowing the sliding block to move vertically up and down on the immobilized pickers, each of the pickers having a vacuum suction device at one end thereof, and a vacuum screw at the other end thereof. The vacuum screw has a hollow projection connected to a vacuum supplier. A spring is disposed beneath respective of the one or more sliding blocks, with the spring being fitted to an outside of the vacuum suction device. Spring stoppers support the springs and fastening devices fasten the one or more sliding blocks to the opposing plate members. The one or more sliding blocks are horizontally movable within the central space between the two opposing plate members by loosening the fastening devices.

6 Claims, 17 Drawing Sheets

LEAD FRAME UNLOADING TOOL HAVING SLIDING BLOCKS

BACKGROUND OF THE INVENTION

1. Field of the Invention

The present invention relates generally to a transfer apparatus which is capable of transferring a lead frame having encapsulated chips to a cut/forming stage during the manufacture of semiconductor packages. More particularly, the present invention relates to a transfer apparatus for transferring lead frames, which is provided with sliding blocks, the position of which can be easily adjusted depending on the lead frame to be unloaded.

2. Description of the Related Arts

In a common assembly process for semiconductor chip packages, an individual chip is separated from a wafer and then attached to a die pad of a lead frame using an adhesive, e.g., Ag-epoxy adhesive ("Die Attach"). The die pad is then electrically connected to inner leads of a lead frame ("Lead Bonding"). Further, the chip, together with the electrical connections, is encapsulated using a molding compound to provide protection from external environmental stresses such as moisture, dust, chemical and physical impacts.

During the assembly process, a number of the semi-assembled packages arranged on a lead frame strip are stored and carried as a stack in a carrier such as a magazine. The lead frame strip (also referred to as "lead frame") having a plurality of semi-assembled packages (also referred to as "molding parts") is subjected to a trimming and forming process wherein leads extending from the molding part are trimmed and formed to have a suitable shape, for example a J-shape or a gull-wing. In order to transfer the lead frame from the magazine to the trimming/forming stage, a lead frame transfer apparatus is employed.

The lead frame transfer apparatus comprises at least one tool for picking up the lead frame (a "picker") by vacuum pressure and transferring it to the trim/form stage. At the trim/form stage, the semiconductor chip and lead frames are trimmed from the rest of the lead frame strip and leads are formed into their final configuration for PWB assembly. Then, marking and branding steps are carried out.

Usually, the packages have different shapes and thus the lead frames of the same widths may have different forming positions. Therefore, appropriate modifications must be made to the existing lead frame transfer apparatus, or a new lead frame transfer apparatus must be employed.

FIG. 1 is a perspective view of a conventional lead frame transfer apparatus; FIG. 2 is a perspective view of an unloading tool of the conventional lead frame transfer apparatus of FIG. 1; and FIG. 3 shows a picker assembly for the lead frame transfer apparatus of FIG. 2.

Referring to FIGS. 1 through 3, the lead frame transfer apparatus 400 comprises a magazine where a plurality of lead frames 5 are stacked and stored. An elevator 200 receives the magazine and lifts the individual lead frame 5 stacked in the magazine to a predetermined height. An unloading tool 100 is provided with pickers for picking up the elevated lead frame 5. A transfer bar 300 is mechanically fixed to the unloading tool 100 at one end and transfers the unloaded lead frame to a trim/form stage with the aid of a power driving means such as a cylinder fixed to the other end of the transfer bar 300.

The movement of all the parts of the apparatus 400 is accomplished by the action of the transfer bar 300, except the vacuum unloading of lead frames 5 by the unloading tool 100.

The unloading tool 100 shown in FIG. 2 has a body 30 provided with a partition wall 10 at its center, and a plurality of suction means (e.g., four pickers 90) fixed through the holes 22 to a bottom fixing side 20 of the body 30. While four pickers 90 are shown in FIG. 1, for simplicity and ease of reference only one picker 90 is shown in FIG. 2.

The body 30 is open at its top, and has a bottom fixing side 20 whose thickness is greater than those of the other sides. The picker 90 is firmly fixed to the fixing side 20.

With reference to FIG. 3, the picker 90 is shown in greater detail and generally consists of three parts: a screw part 40, vacuum suction means 60 and vacuum suction inlet part 70, and washer part 43. The picker 90 also has a nut 65, a spring 68 for supporting the screw, and a stopper 63.

The screw 40 has a groove 42 at its head, and a hollow projection 48 which is inserted into one end of a tube 41 connected to a vacuum means, for example a vacuum pump (not shown). The screw 40 also has a screw thread 46. The screw 40 is hollow from the top to the bottom, and is sometimes called a "vacuum screw".

The vacuum suction means 60 has a cylindrical shape, and is provided with internal spiral grooves 64 corresponding to the screw thread 46, as well as external spiral grooves 66 at its outside surface. The vacuum suction means 60 also has, at its lower part under the spring 68, a groove into which the spring stopper 63 is engaged. The vacuum suction inlet 70 is integral with the lowermost part of the vacuum suction means 60.

In more detail, the picker 90 is fixed to the fixing side 20 of the unloading tool 100 shown in FIG. 2 by the steps of: inserting the top of the vacuum suction means and vacuum suction inlet part into the hole 22 of the fixing side 20, fitting the washer 43 to the outside of the upper body 62, and screwing the screw head 46 of the screw 40 into the internal spiral grooves 64 of the vacuum suction means 60.

Then, the nut 65 is screwed on the external grooves 66 of the vacuum suction means 60 so as to firmly fix the picker to the fixing side 20. A spring 68, for preventing the screw from loosening, is fitted to the suction means 60, and the spring stopper 63 engages the groove 61 to fix the spring 68.

FIGS. 4 through 8 are a sequential diagram showing the unloading of a lead frame 5 using the conventional lead frame transfer apparatus. In operation, the transfer bar 300 fixed to the unloading tool 100 moves down until the vacuum suction inlet 70 of the picker 90 in FIG. 2 contacts the molding part 5' of the lead frame 5 in the magazine 200 with the aid of a driving means such as a cylinder (not shown). Then, as shown in FIG. 5, the molding part 5' of the lead frame is attached to the vacuum suction inlet 70 by a vacuum applied through picker 90. As shown in FIG. 6, the picker 90 moves upward together with lead frame 5 attached thereto, by the action of the transfer bar 300. The lead frame 5 is then transferred by the transfer bar 300 to a trim/form stage for the trim/form process (not shown).

The next lead frame 5 stacked in the magazine is then lifted by the elevator 200. Thereafter, the steps in FIGS. 4 through 6 are repeated. For stable unloading of the lead frame from the magazine, the pickers 90 are positioned so as to be aligned to the molding parts 5' of the unloaded lead frames 5.

FIGS. 7 and 8 show the unloading process of a lead frame using another conventional lead frame transfer apparatus. With reference to FIGS. 7 and 8, the lead frame 15 has molding parts 16 comprising a chip at positions different from those of the lead frame 5 shown in FIGS. 4 through 6. Since the pickers cannot be correctly aligned to the molding parts 16 of the lead frame 15, the pickers can not adequately pick up the lead frame 15, and in the worst case, the lead frame drops as shown in FIG. 8, resulting in the failure of an unloading process for the next lead frame 15 from the magazine.

Thus, the conventional lead frame transfer apparatus 400 reliably unloads the lead frame from the magazine only when its pickers 90 are correctly aligned to the molding parts 5' of the lead frame 5 as shown in FIGS. 4–6. Therefore, in order to unload the lead frame 15 shown in FIGS. 7 and 8, a new or modified unloading apparatus must be employed, resulting in a loss of time and money.

SUMMARY OF THE INVENTION

Thus, an object of the invention is to provide a lead frame unloading apparatus which can unload various lead frames with different molding part orientations by way of a simple adjustment.

This and other objects of the present invention can be accomplished by a lead frame unloading apparatus for manufacturing a semiconductor chip package, the apparatus comprising: a pair of opposing plate members having fastening openings at their respective ends, one of the opposing plate members having a long horizontal slit between the fastening openings, the pair of opposing plate members having top and bottom surfaces bent inwardly so as to face each other, the opposing plate members defining a central space therein; a pair of blocking members, each of which is fixed to the respective ends of the two opposing plate members using a fixing means inserted into respective of the fastening openings; one or more sliding blocks having a vertical through hole at its center, the one or more sliding blocks being disposed between the two opposing plate members; one or more pickers, each of which penetrates through and within the through hole of respective of the one or more sliding blocks, each picker is immobilized when it contacts a lead frame for pickup thereby allowing the sliding block to move vertically up and down on the immobilized pickers, each of the pickers having a vacuum suction means at one end thereof, and a vacuum screw at the other end thereof, the vacuum screw having a hollow projection connected to a vacuum supplier; a spring disposed beneath respective of the one or more sliding blocks, the springs being fitted to an outside of the vacuum suction means of the pickers; respective spring stoppers for supporting the springs; and respective fastening means for fastening the one or more sliding blocks to the opposing plate members, the lead frame apparatus being connected to a driving member, the picker picking up a lead frame from a lead frame stack, and the one or more sliding blocks being horizontally movable within the central space between the two opposing plate members.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 9:
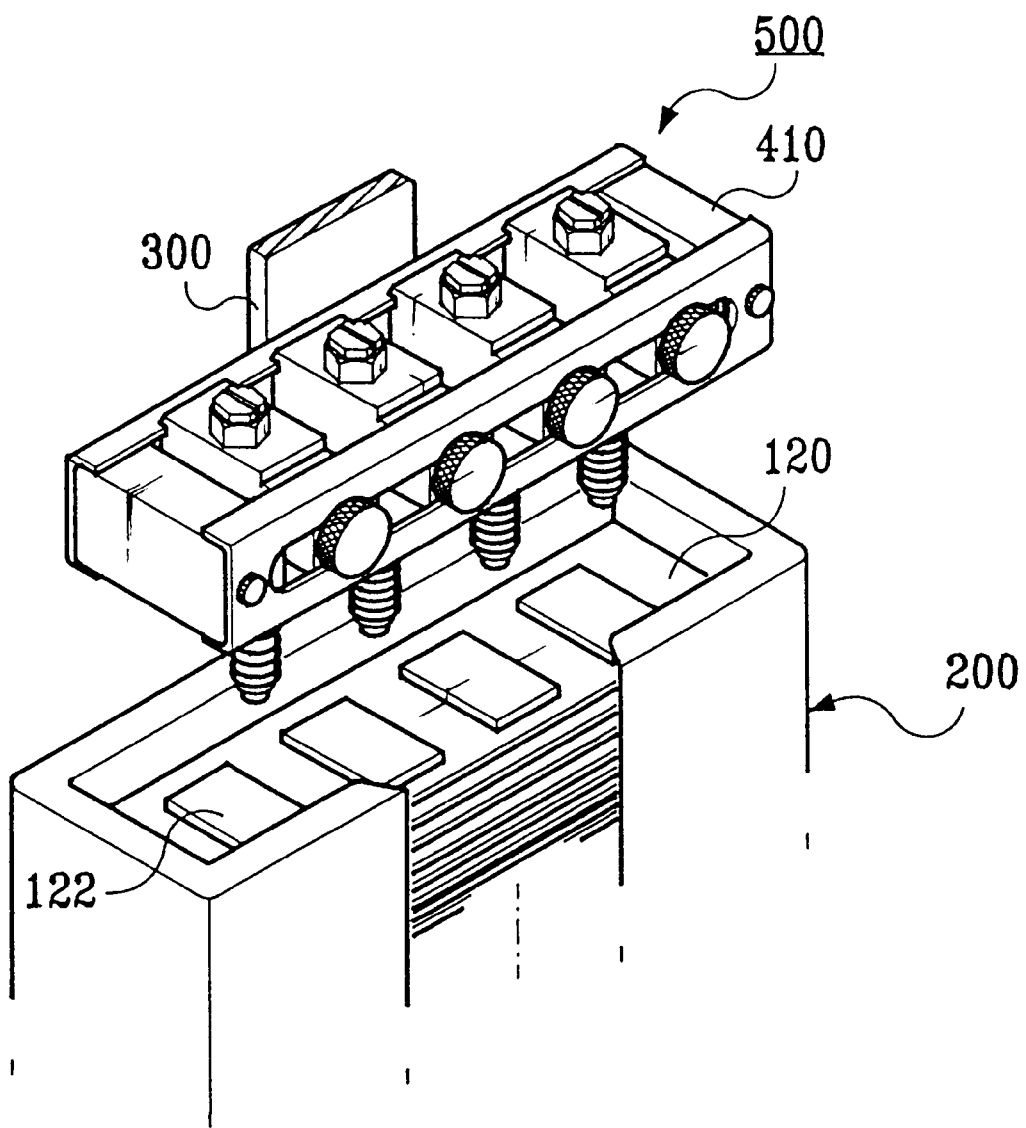
FIG. 9 is a perspective view of a lead frame transfer apparatus according to the present invention.
Figure 10:
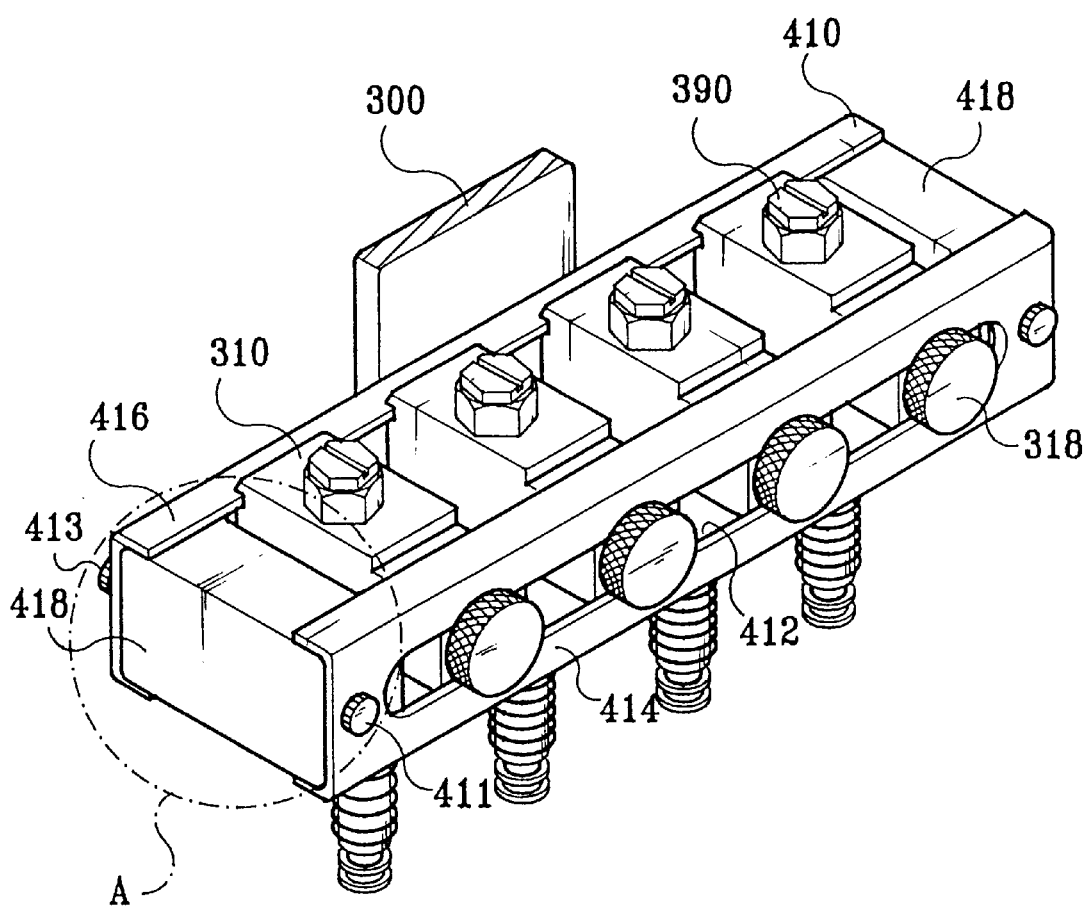
FIG. 10 is a perspective view showing a picker assembly of the lead frame unloading tool according to the present invention.
Figure 11:
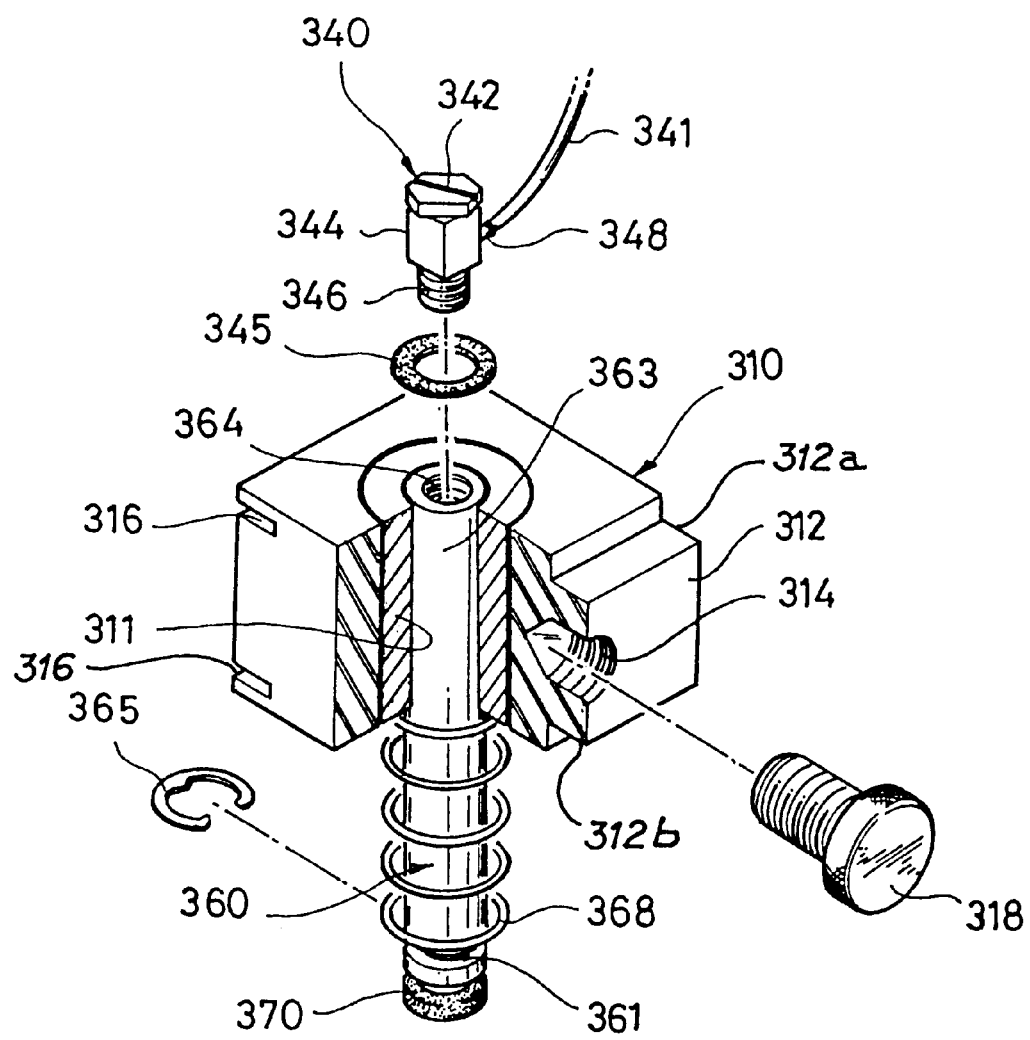
FIG. 11 shows an assembly of the sliding block of the lead frame unloading tool according to the present invention.

FIG. 9 is a perspective view of a lead frame transfer apparatus according to the present invention; FIG. 10 is a perspective view showing a picker assembly of the lead frame unloading tool according to the present invention; FIG. 11 shows the sliding block assembly of the lead frame unloading tool according to the present invention; and FIG. 12 shows an assembly of potion "A" of FIG. 10.

Figure 3:
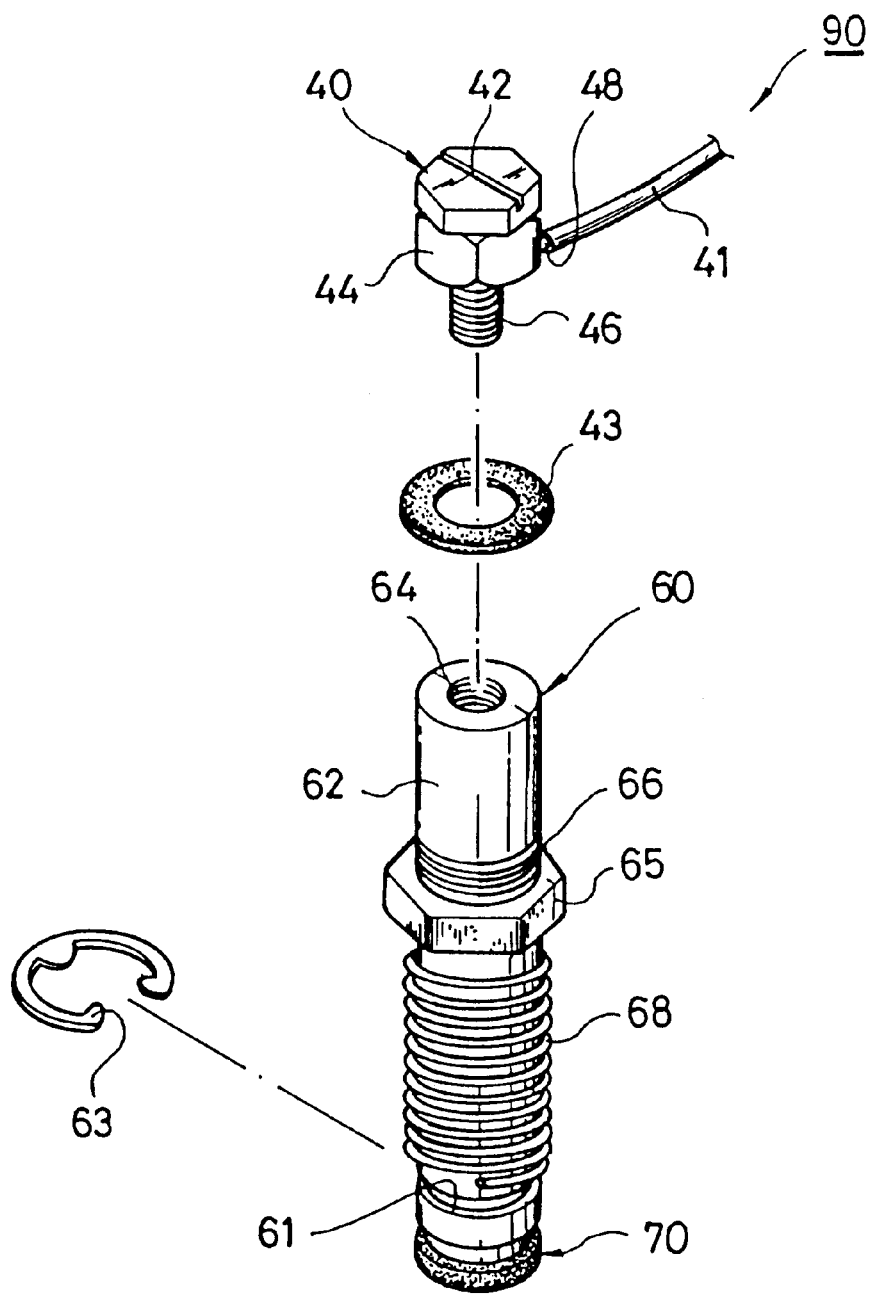
FIG. 3 shows a picker assembly in the lead frame transfer apparatus of FIG. 2.

With reference to FIGS. 9 through 12, the lead frame transfer apparatus 500 according to the present invention has the same structure as that of the conventional transfer apparatus 400 except the former has sliding blocks 310 which can adjust the positioning of the pickers 390 so as to be aligned to molding parts 122 of the lead frame 120 to be unloaded by the pickers 390. The reference numerals in prior art FIG. 3 generally correspond to the same reference numerals in FIG. 11, the only difference being, in FIG. 11, the reference numerals, in most cases, have a 3 preceding the corresponding number of FIG. 3, (i.e. reference numeral 40 in FIG. 3 is equivalent to reference numeral 340 in FIG. 11).

Figure 12:
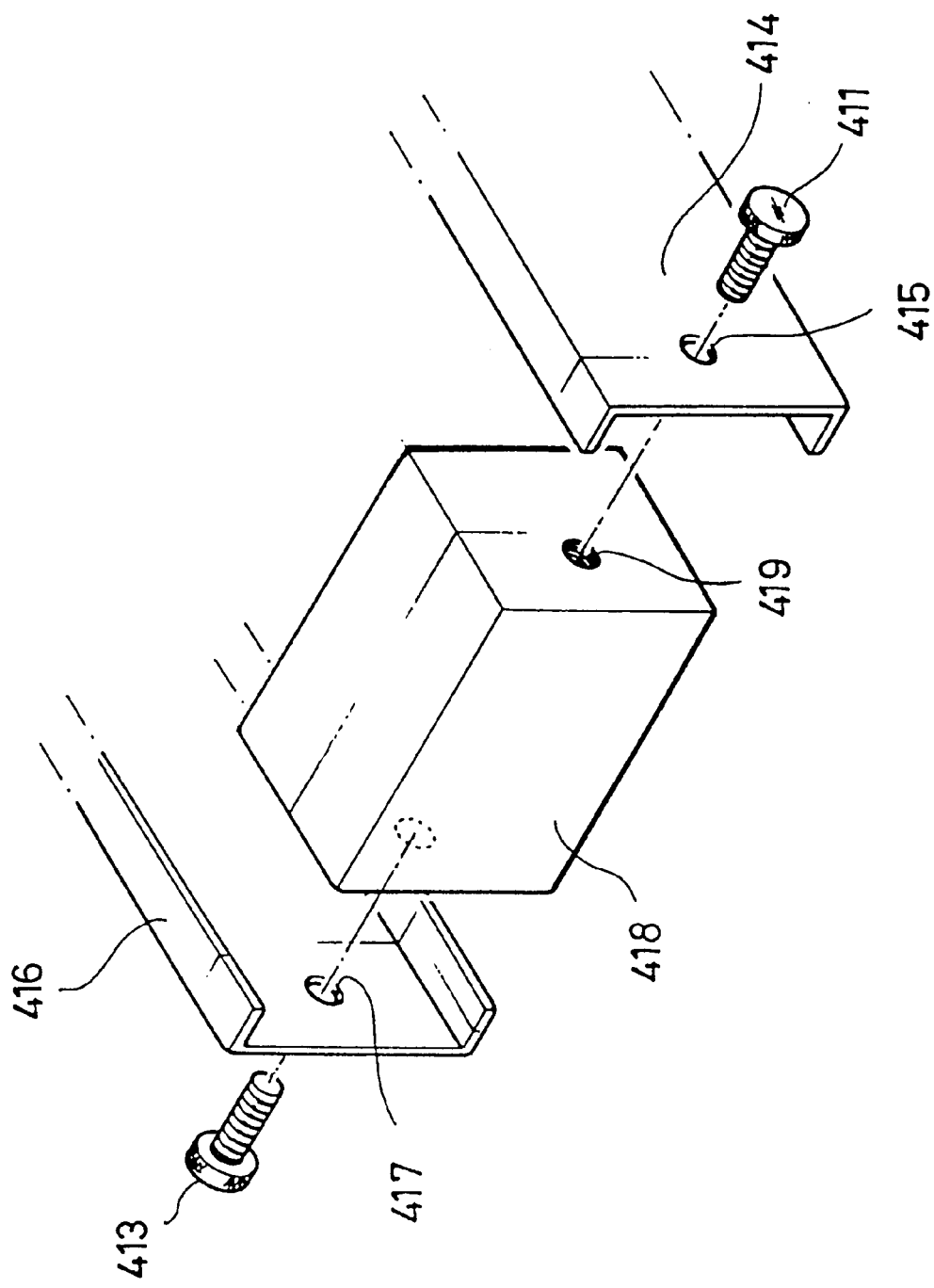
FIG. 12 shows an assembly of portion "A" of FIG. 10.

With reference to FIGS. 10 through 12, the lead frame unloading tool 410 according to the present invention has a pair of opposing plate members 414 and 416, a pair of blocking members 418, each of which is fixed to respective ends of the two plate members 414 and 416, one or more sliding blocks 310, and one or more pickers 390, each of the pickers 390 penetrating through and being immobilized within the corresponding respective sliding blocks 310 so that the position of the pickers 390 can be adjusted depending on the number and position of the molding parts 122 of the lead frame 120 to be unloaded.

Figure 1:
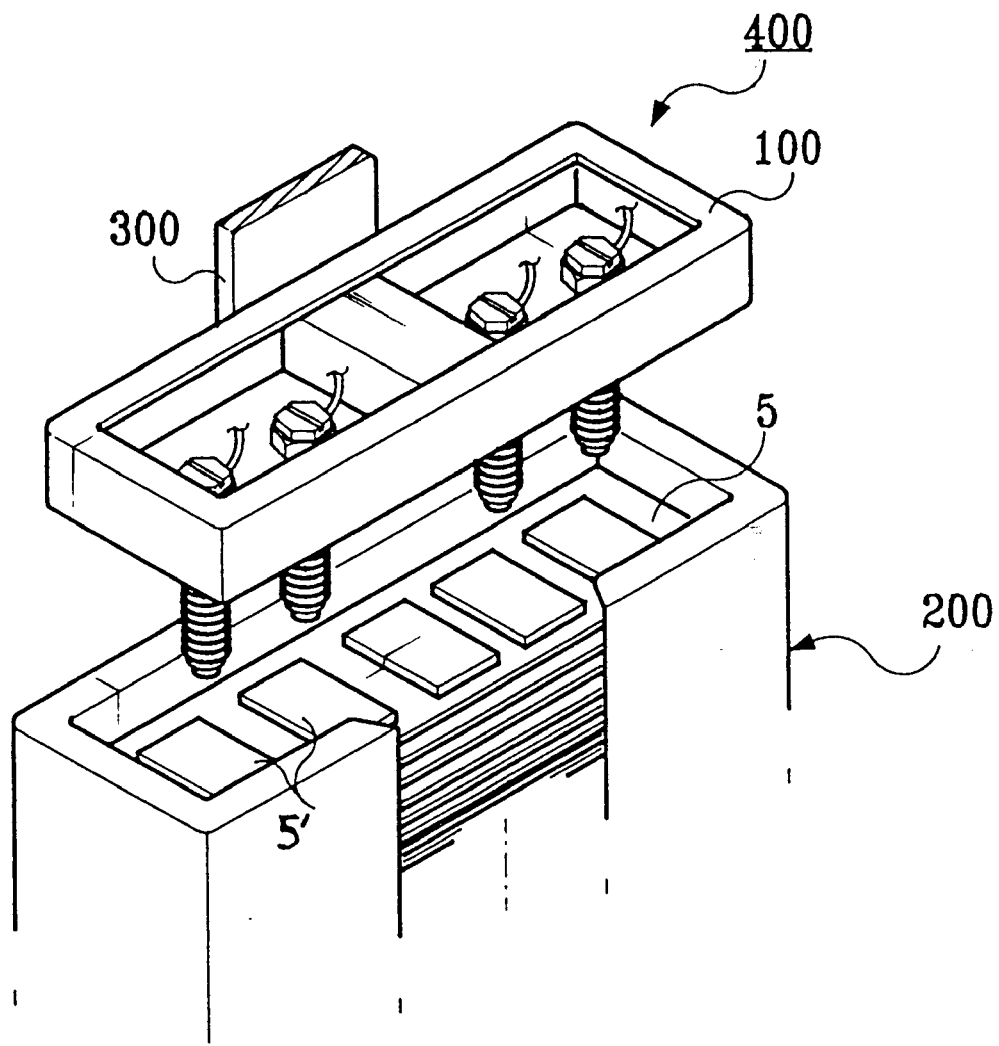
FIG. 1 is a perspective view of a conventional lead frame transfer apparatus.
Figure 2:
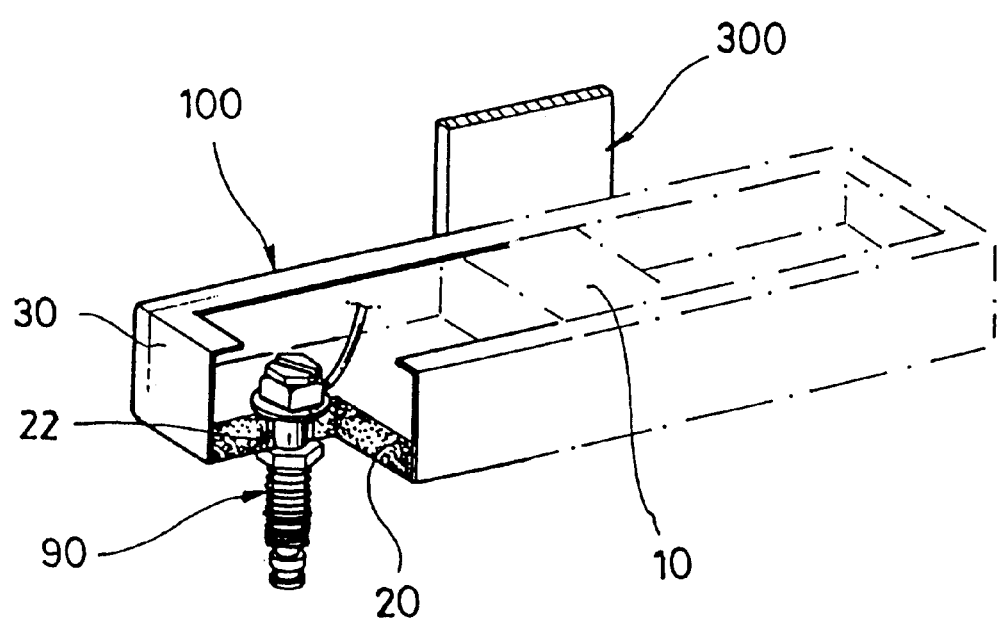
FIG. 2 is a perspective view of an unloading tool of the conventional lead frame transfer apparatus of FIG. 1.

First, the relation of the pickers 390 and corresponding sliding blocks 310 will be explained. Unlike the conventional pickers 90 shown in FIGS. 2 and 3, the pickers 390 according to the present invention have no external grooves 66 and nut 65 for fixing the pickers 90 to the fixing side 20 of the unloading tool. Further, the spring 368 is provided for the purpose of buffering impacts on the vacuum suction means 360. With these exceptions, the pickers 390 have substantially the same structure as that of the conventional one 90 as shown in FIGS. 2 and 3.

The pickers 390 have the lowermost part covered with electrostatic-preventing materials (not shown in the drawings), the lowermost part being contacted with the molding part 122 of the lead frame 120 during unloading process.

The vacuum suction means 360 penetrates through and is movable within a sliding block 310, unlike the conventional picker 90 which penetrates through and is fixed to the fixing side 20 of the body 30. The sliding block 310 has an inner wall 311 made from rubber materials to prevent the horizontal displacement of the picker 390 penetrating therethrough.

For the conventional lead frame unloading tool 400, the picker 90 moves in integration with the unloading tool 400 since the former is fixed to the fixing side 20 of the tool 400.

But, with the unloading tool 410 according to the present invention, the picker 390 can move regardless of the movement of the unloading tool 410 itself, as will be explained hereinafter with reference to FIGS. 13 through 15.

The sliding blocks 310 and the plates 414 and 416 have structures which allow for the free sliding of the blocks 310 and thus the pickers 390. Specifically, the sliding blocks 310 have a step portion at the top 312*a* and bottom 312*b* of one side, e.g., the front side 312, so as to be fitted into the plate member 414. And, the sliding blocks 310 have horizontal slits 316 at predetermined upper and lower areas of another side, e.g., the back side opposite to the side where steps 312*a* and 312*b* are formed, so that it is possible to fit the block 310 into the plate member 416 along slits 316.

The pair of opposing plate members (front plate member 414 and back plate member 416) are bent inwardly at their top and bottom parts so that these bent top and bottom parts face each other as shown in FIG. 10. The sliding blocks 310 have at one side, e.g., the front side 312, a screw hole 314 for receiving a screw 318 for fastening them to one of the pair of plate members, e.g., front plate member 414. For this purpose, the front plate member 414 has a long horizontal slit 412, through which screw 318 fastens the sliding blocks 310 to the front plate member 414.

Moreover, with reference to FIG. 12, which shows the assembly of the pair of plate members 414 and 416 using blocking members 418, both side ends of the one plate member 414 are connected by way of blocking members 418 to the corresponding respective side ends of the other opposing plate member 416. The blocking members 418 have screwed grooves 419 at their two opposing sides which are in contact with the plate members 414 and 416, the grooves 419 being formed so as to be aligned to openings 415 and 417. The blocking members 418 are fastened to the plate members 414 and 416 by using a fastening means, for example, screws 411 and 413 or their equivalent. The long horizontal slit 412 is formed at the front plate member 414 from one side end to the other side end and has a length, for example, at least equal to the distance between the two opposing blocking members 418. The length of the slit 412 may be smaller than the distance between the two opposing blocking members 418 as long as the position of pickers 390 can be adjusted to adequately pick the lead frame up. A plurality of, for example, four pickers 90 can be uniformly disposed between the two opposing blocking members 418.

Figure 4:
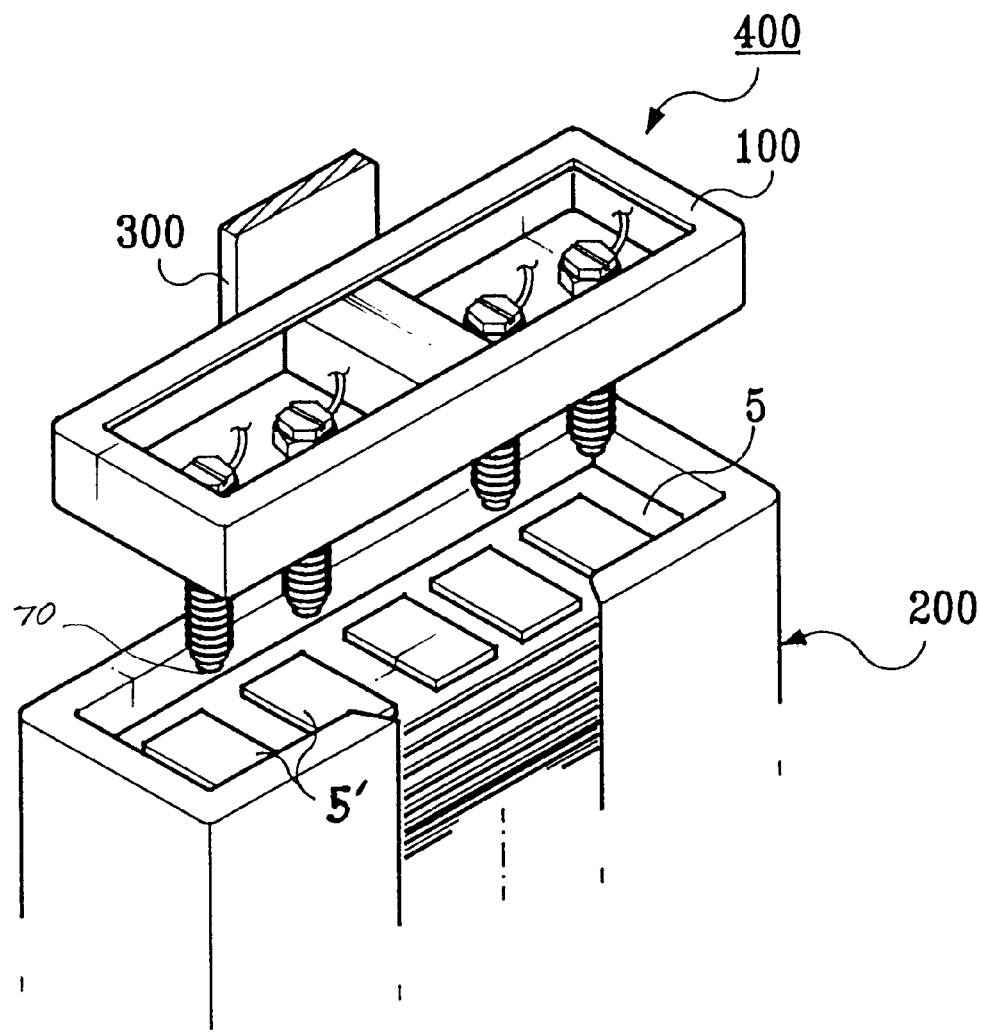
FIG. 4 through FIG. 6 are sequential diagrams showing an unloading process for a lead frame using the conventional lead frame transfer apparatus.
Figure 5:
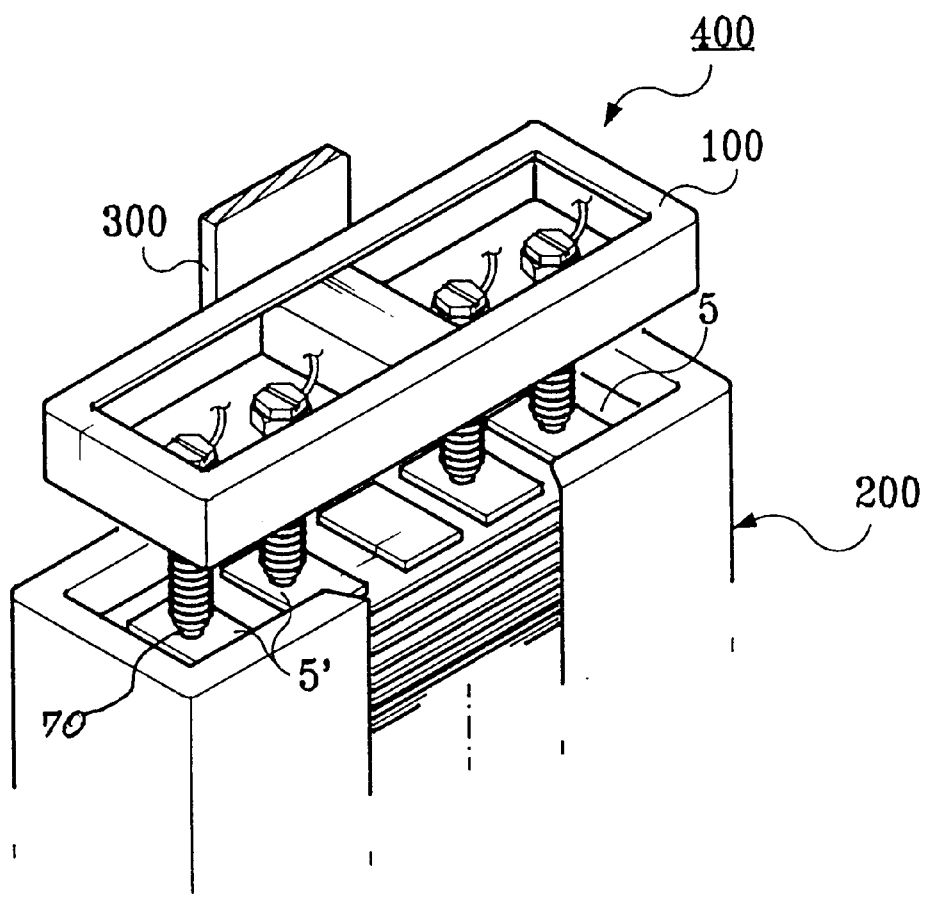
Figure 6:
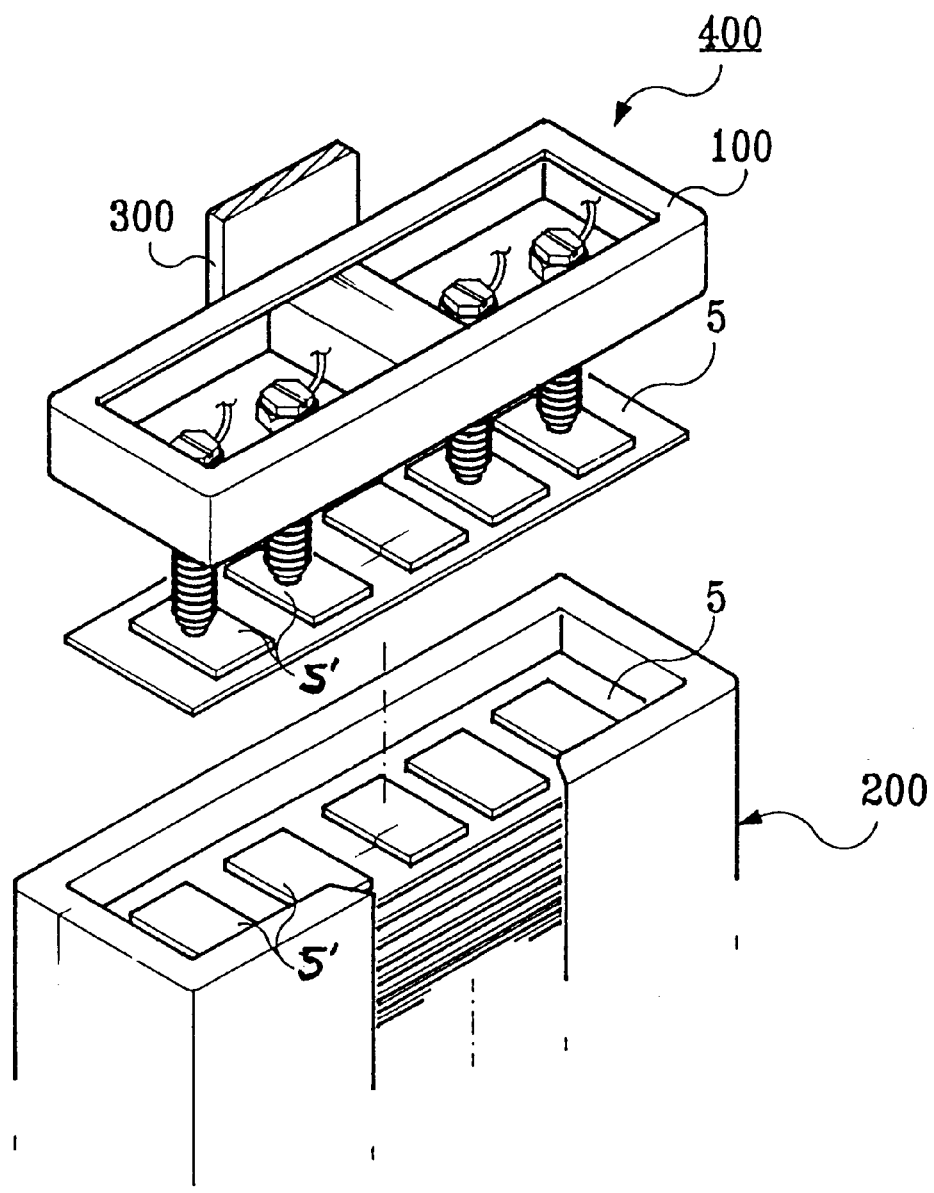
Figure 7:
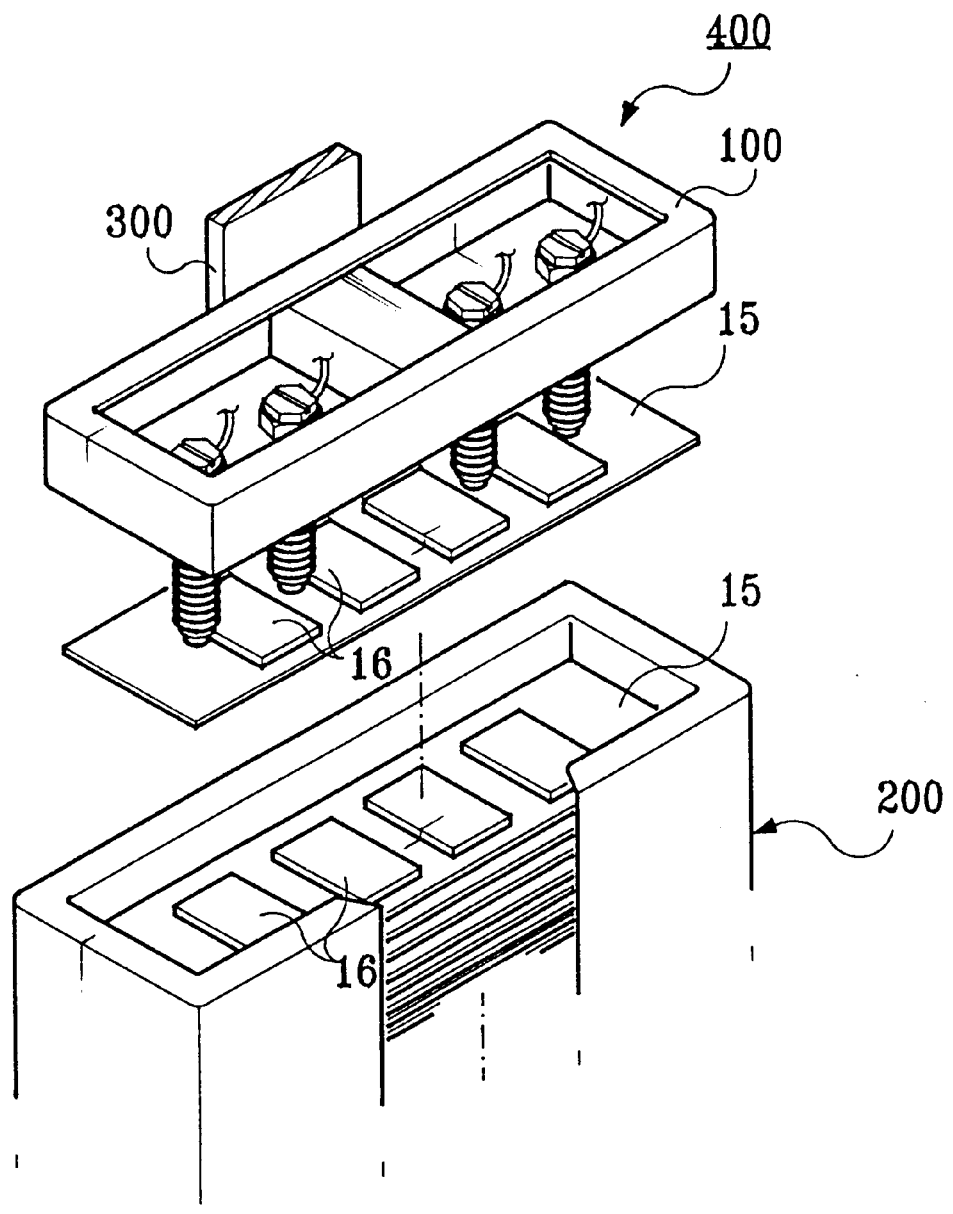
FIG. 7 and FIG. 8 show an unloading process for a lead frame using another conventional lead frame transfer apparatus.
Figure 8:
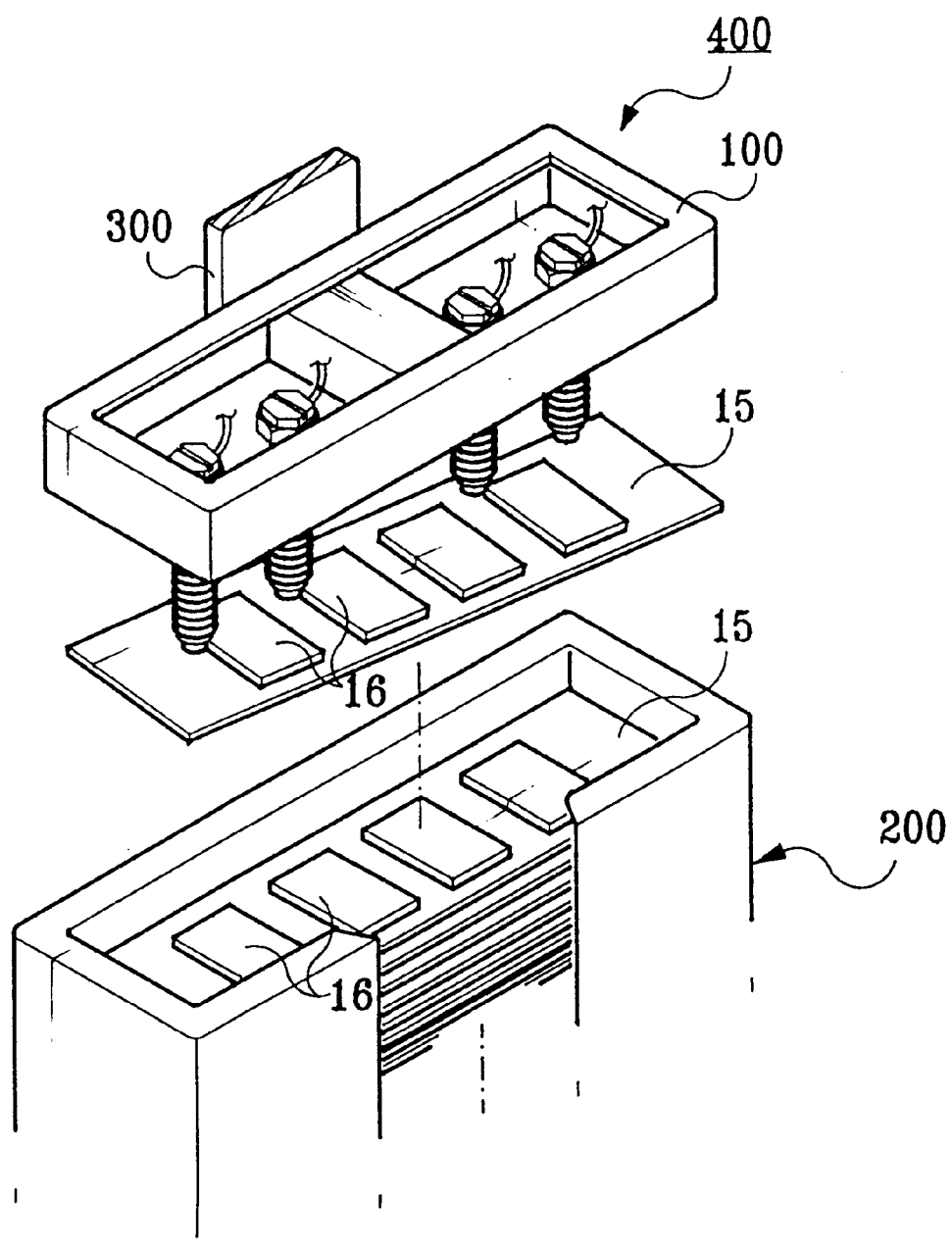
Figure 13:
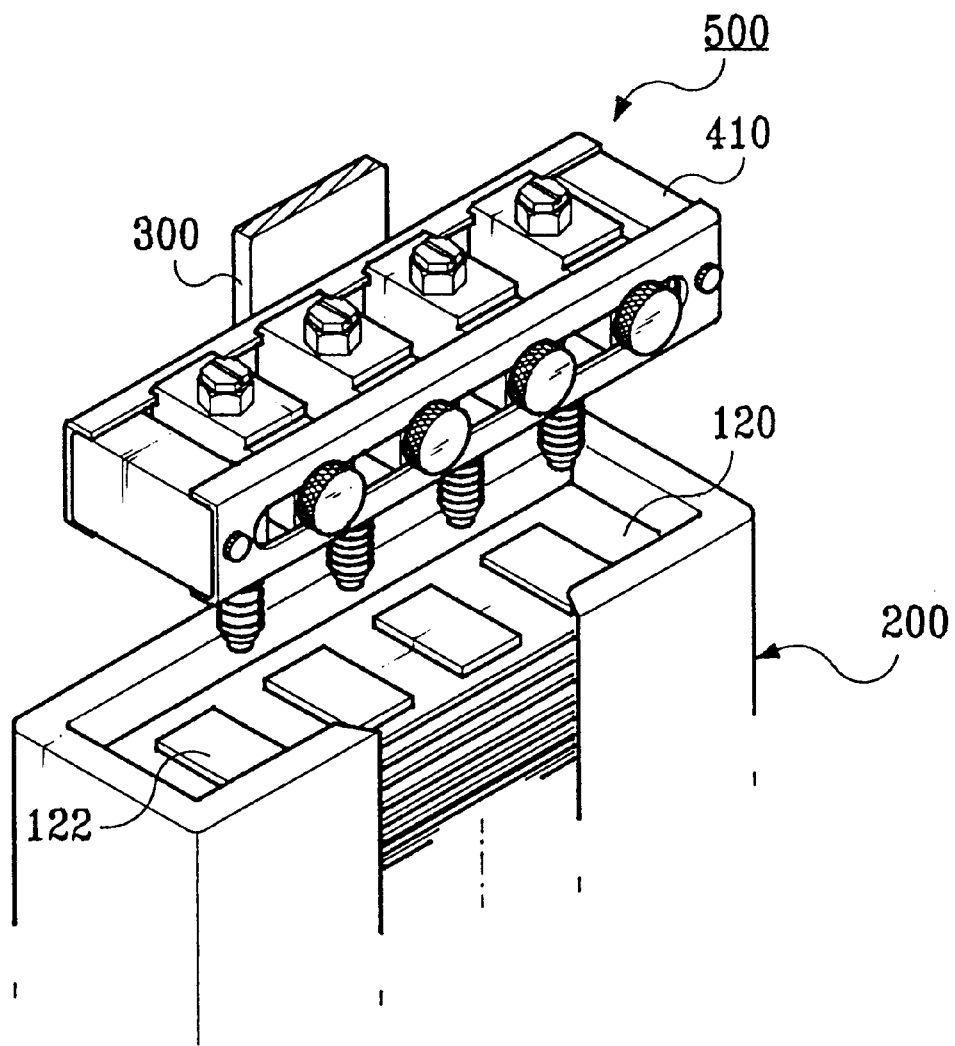
FIG. 13 through FIG. 15 are sequential diagrams showing an unloading process for the lead frame using the lead frame transfer apparatus according to the present invention.
Figure 14:
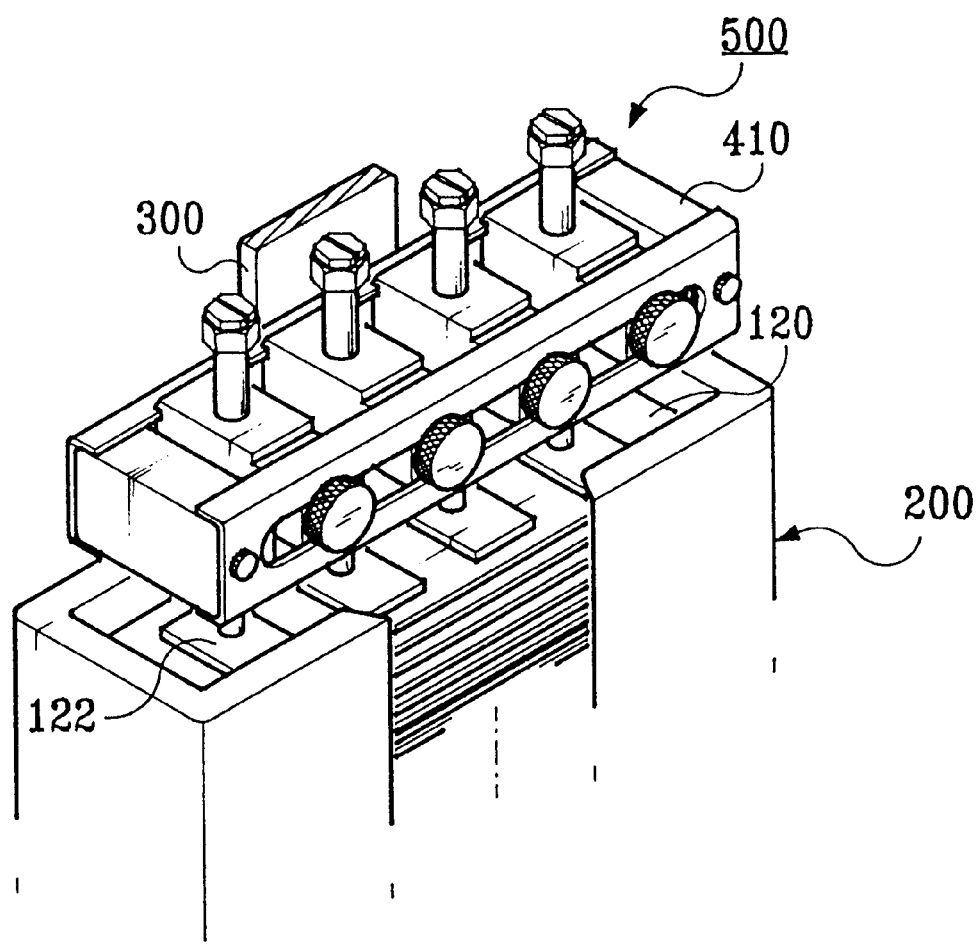
Figure 15:
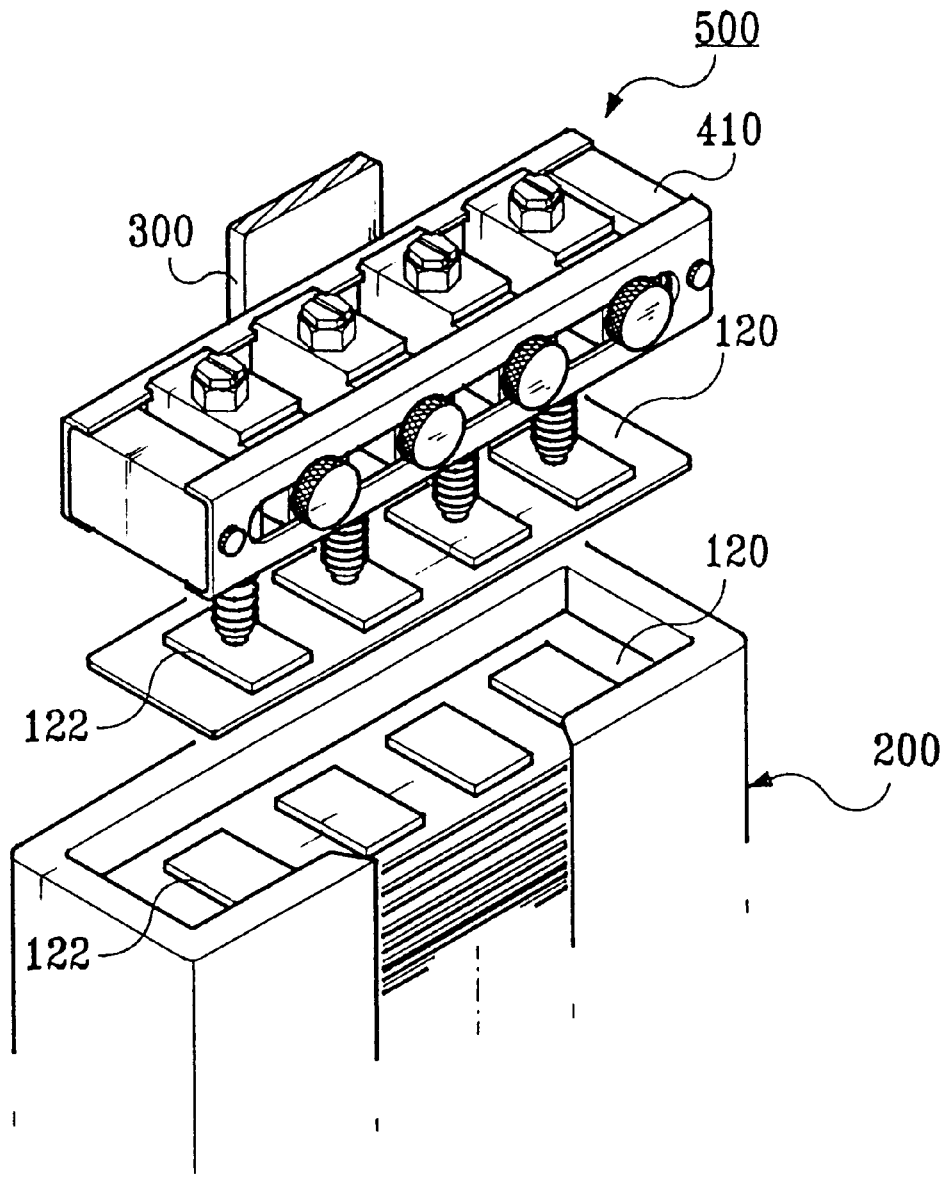

FIG. 13 through FIG. 15 are sequential diagrams showing an unloading process for the lead frame 120 using the lead frame transfer apparatus according to the present invention. FIGS. 13 through 15 show the unloading process for the lead frame 120 having four molding parts 122 using the tool 410, which is carried out in the same manner as that of the unloading process shown in FIGS. 4 through 6.

However, with reference to FIG. 11, the pickers 390 of the unloading tool 410 of the present invention are not fixedly attached to the sliding block 310. Instead, the pickers 390 are immobilized when they contact the molding parts of the lead frame thereby allowing the sliding block to move vertically up and down on the immobilized pickers by the action of the springs 368, which push the sliding blocks 310 upward and are located between the bottom of the sliding blocks 310 and the spring stopper 365. The sliding blocks 310 are fixed to the plate members 414 and 416 by way of the screws 318. Preferably, the spring 368 is not too elastic.

According to the present invention, when the vacuum suction inlet 370 mechanically contacts the molding part 122 of the lead frame 120, the picker 390 does not move downward any more. Instead, the unloading tool 410 itself moves downward.

This solves a problem associated with the conventional lead frame unloading tool 100. With the conventional unloading tool 100, the lead frame 5 or 15 is adhered to the picker by vacuum action after the picker 90 (see FIG. 3) mechanically contacts the molding parts 5' or 16. In such a case the picker 90 may adversely impact the molding parts 5' or 16 due to operational errors of the unloading tool 100, consequently resulting in package cracks or chip cracks.

Figure 16:
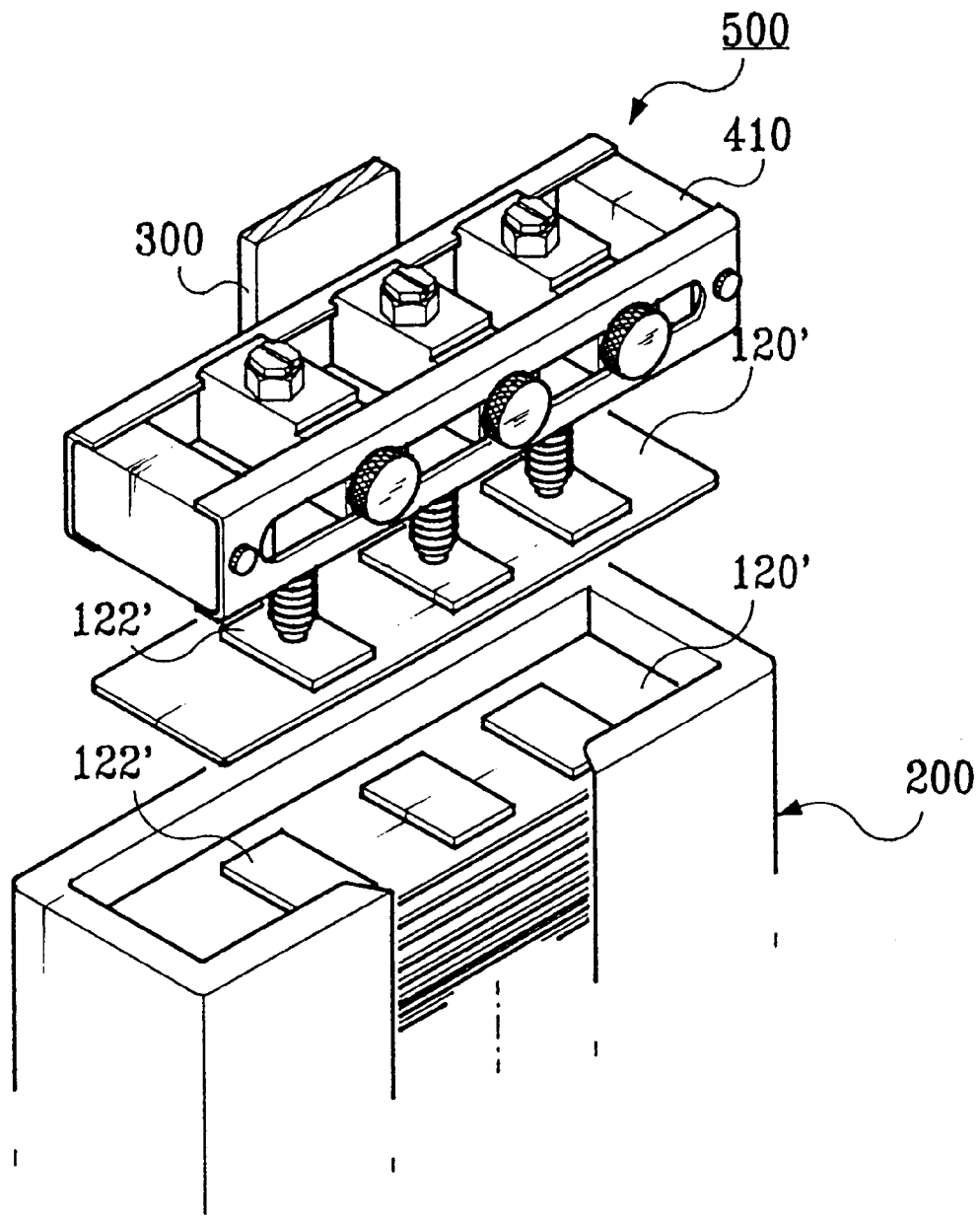
FIG. 16 shows an unloading process of a lead frame using another lead frame transfer apparatus according to the present invention.
Figure 17:
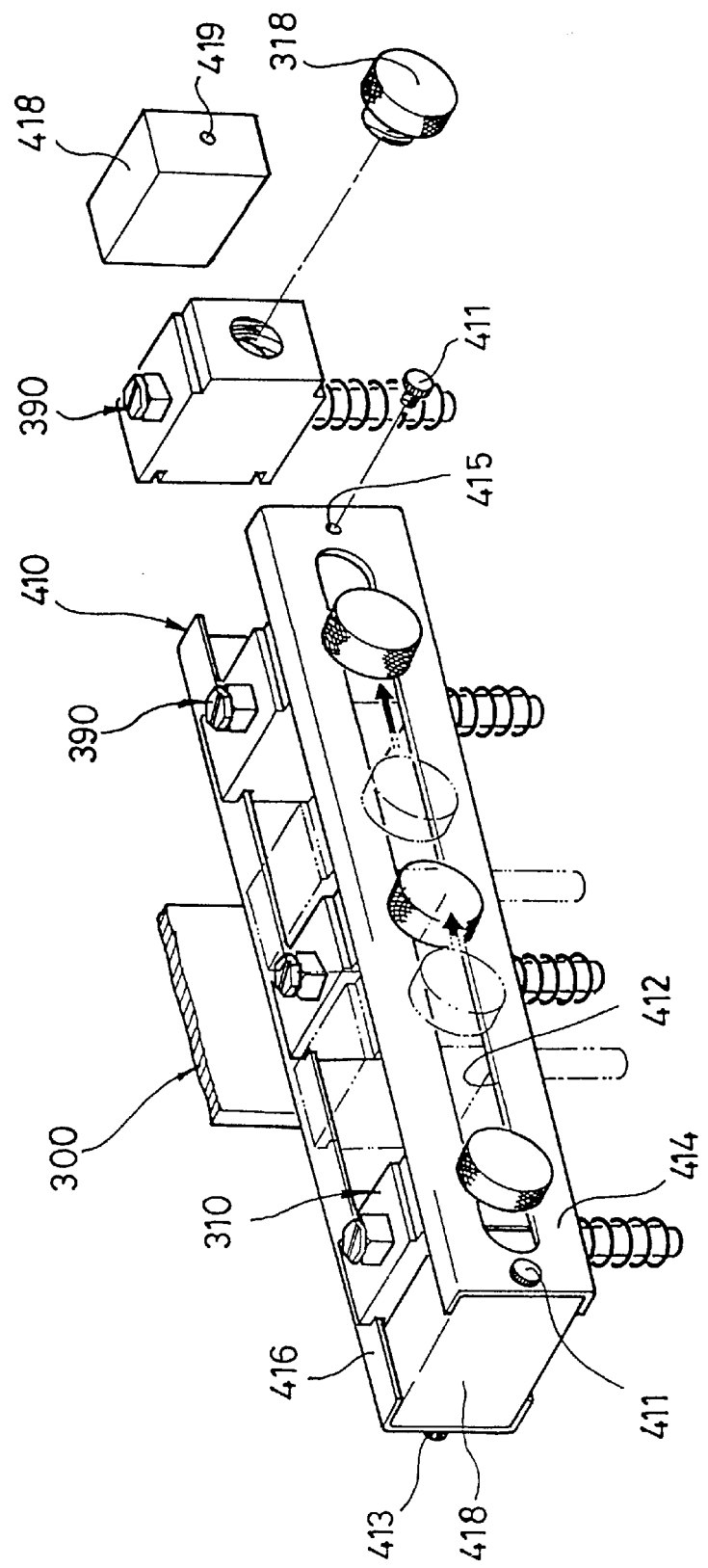
FIG. 17 is an enlarged view of FIG. 16.

FIG. 16 shows an unloading process for the lead frame using another lead frame transfer apparatus according to the present invention and FIG. 17 is an enlarged view of FIG. 16.

With reference to FIG. 16, the lead frame 120' is unloaded from the elevator 200 by lead frame transfer apparatus 410. The lead frame 120' has three molding parts 122'. FIG. 17 shows how the position of the pickers 390 can be adjusted depending on the number or position of molding parts 122' of the unloaded lead frame 120' without modifying the design of the unloading tool 410 or replacing the tool 410.

The process is as follows. First, screws 411 and 413 which fasten the blocking member 418 to the plate members 414 and 416 are loosened by using, for example, a screw driver. Next, the blocking member 418 is removed from the plate members 414 and 416. The screw 318 fastening the sliding block 310 to the front plate member 414 is loosened and removed by using, for example, a screw driver. The loosened sliding block 310 is removed from the unloading tool 410 and the blocking member 418 is again fitted between the two plate members 414 and 416 so as to align its grooves 419 to the holes 415 and 417 of the plate members 414 and 416. The blocking member 418 is then fastened to the plate members 414 and 416 by using screws 411 and 413. The remaining three screws 318 are loosened and the three sliding blocks 310 are moved so that they can be aligned to the molding parts 122' of the lead frame 120'. Finally, the screws 318 are tightened to fix the sliding blocks 310 to the plate members 414 and 416.

Preferably, the above steps are carried out in order. However, the blocking member 418 may be re-fitted to the plate members 414 and 416 after the screws 318 are tightened to fix the sliding blocks 310 to the plate members 414 and 416.

Although FIGS. 16 and 17 depict the unloading process for a lead frame with three molding parts 122', it is within the scope of the present invention that a lead frame having five or more molding parts can be effectively unloaded by employing longer plate members and adding additional pickers.

Moreover, it is within the scope of the present invention that the pickers may be arranged so as to be in contact with every other molding part when a sufficiently strong vacuum can be applied.

In addition, while FIG. 11 shows the unloading tool in which the sliding block has front and back sides that are different from each other, the front and back sides may have the same configuration, either steps 312a, 312b or slots 316, and be modified as long as the sliding block 310 can slide along the plate members 414 and 416.

According to the present invention, the unloading of various lead frames having different numbers of molding parts may be accomplished by a simple manual adjustment of the location and number of pickers of the lead frame unloading tool, resulting in an increase in the operational efficiency of the assembly process while reducing manufacturing costs.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A lead frame unloading apparatus for manufacturing a semiconductor chip package device, said apparatus comprising:

a pair of opposing plate members having fastening openings at their respective ends, one of said opposing plate members having a long horizontal slit between the fastening openings, said pair of opposing plate members having top and bottom surfaces bent inwardly so as to face each other, said opposing plate members defining a central space therein;

a pair of blocking members, each of which is fixed to the respective ends of said two opposing plate members using a fixing means inserted into said fastening openings;

one or more sliding blocks having a vertical through hole at its center, said one or more sliding blocks being disposed between said two opposing plate members;

one or more pickers, each of which penetrates within said through hole of respective said one or more sliding blocks, when the one or more pickers contact a lead frame, the one or more pickers become immobilized, thereby allowing the one or more sliding blocks to move vertically up and down on the immobilized one or more pickers each of the pickers having a vacuum suction means at one end thereof, and a vacuum screw at the other end thereof, said vacuum screw having a hollow projection connected to a vacuum supplier;

a spring disposed beneath respective of said one or more sliding blocks, said springs being fitted to an outside of said vacuum suction means of the pickers;

respective spring stoppers for supporting the springs; and respective fastening means for fastening said one or more sliding blocks to the opposing plate members through said long horizontal slit, said lead frame apparatus being connected to a driving member, said picker picking up a lead frame from a lead frame stack, and said one or more sliding blocks being horizontally movable within the central space between said two opposing plate members by loosening and tightening the fastening means.

2. The lead frame unloading apparatus of claim 1, wherein said one or more sliding blocks have front and rear sides having one of steps and slits disposed in a horizontal direction, said steps and slits engaging the inwardly bent top and bottom surfaces of the opposing plate members, whereby the one or more sliding blocks are supported as they horizontally slide within the central space between the opposing plate members.

3. The lead frame unloading apparatus of claim 1, wherein each of said one or more pickers comprises a washer disposed between the vacuum screw and the vacuum suction means.

4. The lead frame unloading apparatus of claim 1, wherein said through hole of the one or more sliding blocks has an inner wall made from a rubber material so that the picker penetrating through the hole is prevented from being horizontally displaced.

5. The lead frame unloading apparatus of claim 1, wherein a lowermost part of each of said one or more pickers is covered with an electrostatic-preventing material.

6. The lead frame unloading apparatus of claim 5, wherein said lowermost part is for contacting a molding part encapsulating a semiconductor device of a lead frame to be unloaded during a lead frame unloading process.

* * * * *